United States Patent
Huggett et al.

(10) Patent No.: US 7,783,963 B2
(45) Date of Patent: Aug. 24, 2010

(54) DECODING A CONCATENATED CONVOLUTIONAL-ENCODED AND BLOCK ENCODED SIGNAL

(75) Inventors: Anthony Richard Huggett, Southampton (GB); Adrian Charles Turner, Southampton (GB)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 946 days.

(21) Appl. No.: 11/597,153

(22) PCT Filed: May 19, 2005

(86) PCT No.: PCT/GB2005/001981

§ 371 (c)(1),
(2), (4) Date: Nov. 21, 2006

(87) PCT Pub. No.: WO2005/117271

PCT Pub. Date: Dec. 8, 2005

(65) Prior Publication Data

US 2007/0220408 A1   Sep. 20, 2007

(30) Foreign Application Priority Data

May 26, 2004   (GB) ................... 0411797.4

(51) Int. Cl.
*H03M 13/03* (2006.01)
(52) U.S. Cl. ............ 714/795; 714/794; 714/796; 375/262; 375/341
(58) Field of Classification Search ............ 714/755, 714/794–796; 375/262, 341
See application file for complete search history.

(56) References Cited

U.S. PATENT DOCUMENTS 5,524,027 A * 6/1996 Huisken .............. 375/341

(Continued)

FOREIGN PATENT DOCUMENTS

EP        0 986 180 A1      3/2000

(Continued)

OTHER PUBLICATIONS

Collins O M et al, "Determinate state convolutional codes", IEEE Transactions on communications, IEEE Inc. New York, US, vol. 41, No. 12, Dec. 1, 1993, pp. 1785-1794.

(Continued)

*Primary Examiner*—Esaw T Abraham
(74) *Attorney, Agent, or Firm*—Thomas Bethea, Jr.

(57) ABSTRACT

Encoded symbols of a concatenated convolutional-encoded and block encoded signal are presented to a conventional first stage of a concatenated decoder, comprising in sequence a soft metric generator, a Viterbi decoder, a first de-interleaver and a first block decoder such as a Reed-Solomon decoder. The encoded symbols are also presented to a delay chain to produce progressively delayed encoded symbols. Where an output block of the conventional decoder is indicated as being a valid codeword by the first block decoder, the bytes in this block are marked as being correct. These bytes that are known to be correct are then used after interleaving and serialization as known bits input to a second stage of the decoder process operating on the delayed encoded symbols and incorporating a modified soft metric generator constrained by the known bits. This process can be extended to further iterations as required. A modified Viterbi decoder, which is also constrained by the known bits, may also be used in the second and subsequent iterative stages.

10 Claims, 5 Drawing Sheets

U.S. PATENT DOCUMENTS

| | | | |
|---|---|---|---|
| 5,878,085 A | | 3/1999 | McCallister et al. |
| 6,031,874 A | * | 2/2000 | Chennakeshu et al. ...... 375/262 |
| 6,147,964 A | * | 11/2000 | Black et al. .................. 370/209 |
| 6,272,661 B1 | * | 8/2001 | Yamaguchi .................. 714/795 |
| 6,606,724 B1 | | 8/2003 | Krieger et al. |
| 6,944,206 B1 | * | 9/2005 | Dent .......................... 375/144 |
| 2002/0051499 A1 | * | 5/2002 | Cameron et al. ............ 375/295 |
| 2003/0192001 A1 | | 10/2003 | Maiuzzo et al. |
| 2003/0221156 A1 | | 11/2003 | Berger et al. |

FOREIGN PATENT DOCUMENTS

| | | |
|---|---|---|
| EP | 1 467 492 A1 | 10/2004 |

OTHER PUBLICATIONS

Lei Cao et al, "A novel product coding and decoding scheme for wireless image transmission", Proceedings 2000 International Conference on Image Processing, ICIP 2000, Vancouver, Canada, Sep. 10-13, 2000, International Conference on Image Processing, New York, US, vol. 2 of 3, conf. 7, Sep. 10, 2000, pp. 144-147.

Sawaguchi H et al, "A concatenated coding technique for partial response channels", IEEE Transactions on Magnetics, IEEE Inc, New York, US, vol. 37, No. 2, pt1, Mar. 2001, pp. 695-703.

* cited by examiner

US 7,783,963 B2

DECODING A CONCATENATED CONVOLUTIONAL-ENCODED AND BLOCK ENCODED SIGNAL

This application is a U.S. National Phase of International Patent Application Serial No. PCT/GB2005/001981, filed May 19, 2005 which claims priority to British Patent Application No. 0411797.4 filed May 26, 2004.

BACKGROUND OF THE INVENTION

1. Field of the Invention

This invention relates to decoding a concatenated convolutional-encoded and block-encoded signal. In particular, the invention is applicable to decoding concatenated outer code blocks, eg Reed-Solomon, and convolutional or pragmatic trellis coded modulation (PTCM) data using constellations of higher order than Quadrature Phase Shift Keying (QPSK). More particularly it is applicable to such modulation systems when the symbol mapping results in more than 1 outer code block carrying the bits of each channel symbol.

2. Description of the Related Art

An inner code often implemented as a convolutional code is performed by, for example, a Viterbi decoder, and from Collins [TIEEE on Communications, Vol. 42, No. 12 December 1993, pp 1785-1794] and Krieger [U.S. Pat. No. 6,606,724]. Collins teaches that the results of the outer decoder can be used by a second decoder chain in particular to produce a beneficial change in the output of its Viterbi stage when the outer code indicates known correct data. Krieger also teaches the same method as Collins and also teaches that this process can be iterated to provide further performance improvements. Krieger also provides descriptions of apparatus whereby the effect may be realised, in particular in FIGS. 2 and 5 thereof. FIG. 2 of Krieger illustrates a mechanism that switches the input of a second Viterbi decoder to recoded correct bits only when the outer code indicates known correct data. This action makes redundant any soft metrics data used by the Viterbi decoder and so these are set to some default extreme value. Krieger FIG. 5 illustrates an alternative mechanism that achieves broadly similar results. In FIG. 5 there is no convolutional recoding so that the Viterbi decoder is not switched to corrected input data but retains the noisy data. Its Viterbi decoder is also driven to take previously determined actions dependent on an indication from the outer coder. These actions involve modifying the weight calculations within the Viterbi decoder. In neither Krieger FIG. 2 or 5 is there any specific provision that causes the second decoder chain to act differently from the first on the data which is marked as incorrect so that any beneficial result happens indirectly as a result of the direct action on the correct bits.

A modified Viterbi decoder and a method for improved decoding of concatenated codes using the modified Viterbi decoder are known from GB-A-2400002.

In GB-A-0307092.7, that disclosure in second and subsequent iterations using the modified Viterbi decoder, coding decisions are constrained by data which has already been verified by correct block decoding such as Reed-Solomon decoding in a previous iteration. However, in known Forward Error Correction (FEC) decoders, including both Digital Video Broadcasting-Digital Satellite News Gathering (DVB-DSNG) and Digital Video Broadcasting-Terrestrial (DVB-T), for constellations higher than QPSK, a soft metric generator within the decoder generates input to the Viterbi decoder from the received channel symbols. That is, with Binary Shift Keying (BPSK) or QPSK the soft metric is simply an amplitude of a signal in an in-phase (I) or quadrature (Q) sense. The soft metric generator is then trivial. In a higher order constellation the relationship is much more complex.

Using, for example, 8 Phase Shift Keying (8PSK) rate ⅔ according to the DVB-DSNG European Telecommunications Standards Institute (ETSI) specification EN 301-210, a coded constellation is constructed by taking two input bits from different bytes in a data stream. A first of these two input bits is applied to an input of a rate ½ convolutional encoder of constraint length 7, using polynomials 133_8 and 171_8, where _8 signifies base 8, as used in the art for such polynomials. Since the encoder is rate ½, two coded bits are obtained, which are denoted C1 and C2 herein. A second of the two input bits, which is not passed to the convolutional encoder, is denoted U1. This results in a symbol of three bits, one uncoded U1, and two coded C2, C1, giving eight possible combinations, which may be mapped to a constellation of eight points—the ETSI specification uses a particular mapping to 8PSK.

When received at a decoder, the demodulated signal contains noise generated during transmission so that a received symbol can lie anywhere on an IQ plane—but with a high probability of being near to a point which was actually transmitted. A soft metric generator is provided to generate two soft metrics to feed to a rate ½ Viterbi decoder. The soft metrics form a noisy convolutional-encoded data stream to be decoded by the Viterbi decoder. The Viterbi decoder takes these soft metrics (which are signal levels representative of convolutional encoded data, with some random noise added) and produces a stream of Viterbi-decoded data bits. For a constellation of higher order than two, each IQ symbol contains more than two bits of channel information.

In order to recover the uncoded bits in a conventional PTCM decoder, the following steps are performed: a) Generate soft metrics from the received symbols. b) Decode the convolutional-encoded bits to produce Viterbi-decoded bits. c) Re-encode these Viterbi-decoded bits and use these conditionally to demap the uncoded bits (where "uncoded" means "un-convolutional-encoded".) d) Take the Viterbi-decoded bits and the uncoded bits, and align them correctly. However, the calculation of soft metrics in the prior art does not take into account that some of the decoded bits are known to be correct.

SUMMARY OF THE INVENTION

It is an object of the present invention at least to ameliorate the aforesaid shortcomings in the prior art, to improve decoding of higher order modulated signals by providing reduced output bit error rate (BER) for a same input noise level. In particular, where some of the received bits are known with certainty, then the soft metrics that are generated for the remaining uncertain bits should take the known bits into account.

According to a first aspect of the present invention there is provided a method of decoding a concatenated convolutional-encoded and block encoded signal, the method comprising the steps of: a) applying the encoded signal to first soft metric generator means to generate soft metrics and to first delay means to output a delayed encoded signal; b) applying the first soft metrics to Viterbi decoder means to decode the soft metrics representing convolutional-encoded symbols of the encoded signal and to output a first block encoded Viterbi-decoded signal;

c) decoding the block encoded signal with block decoder means and marking decoded bits identified as belonging to correctly decoded blocks to form a marked decoded signal; d) applying the delayed encoded signal and the marked decoded signal to modified soft metric generator means arranged to generate modified soft metrics constrained by the decoded bits identified as belonging to correctly decoded blocks to generate modified soft metrics consistent with the decoded bits identified as belonging to correctly coded blocks; e) applying the modified soft metrics to second Viterbi decoder means to decode the modified soft-metrics representative of convolutional-encoded symbols of the delayed encoded signal and to output a block encoded second Viterbi-decoded signal; and f) decoding the block encoded second Viterbi-decoded signal with second block decoder means and outputting a second decoded signal.

As stated above, in neither Krieger FIG. 2 or 5 is there any specific provision that causes the second decoder chain to act differently from the first on the data which is marked as incorrect so that any beneficial result happens indirectly as a result of the direct action on the correct bits. In no case described by Collins or Krieger is the soft symbol metric representation of the input signal to the Viterbi decoders usefully recalculated from the very first estimation; each stage is driven by the same signal. All modification takes place within the Viterbi process and therefore takes no value from the potential for improved performance resulting from the impact of decision feedback on the generation of new natural unforced soft symbol metrics.

As will be described in more detail below, the present invention provides for a recalculation of the soft symbol metrics at each Viterbi decoder input, this recalculation being influenced by the outer decoder indications of correct decodes.

The recalculation of soft symbol metrics dependent on the outcome of outer coding in this case adds benefits to overall decoding performance and in this invention this is done before each of the Viterbi decoders included in second and subsequent iterations.

Step (d) above introduces a solution to the forenoted problem of the prior art by applying corrective indications to a soft symbol metric calculation which is added to each iterated stage.

Advantageously, the method comprises the further steps of: g) marking decoded bits identified as belonging to correctly decoded blocks in the second decoded signal to form a second marked decoded signal; and h) iteratively repeating steps d) to f) with the second marked decoded signal, to output a further decoded signal.

Preferably, step e) comprises applying the delayed encoded signal, the modified soft metrics and the marked decoded signal to modified Viterbi decoder means wherein the modified Viterbi decoder means is arranged to be constrained by the decoded bits identified as belonging to correctly decoded blocks to constrain the Viterbi decoding to bit values consistent with the decoded bits identified as belonging to correctly coded blocks.

Conveniently, the method is arranged for decoding a DVB-DSNG signal, wherein step c) comprises: c1) applying the first Viterbi-decoded signal and the delayed encoded signal to demap uncoded data and byte sync means to estimate an uncoded bit from the delayed encoded signal and from a re-coded convolutional-encoded version of the first Viterbi-decoded signal; c2) synchronising the resultant bits and assembling the synchronised resultant bits into bytes; c3) de-interleaving the bytes; and c4) decoding the bytes with the block decoder means and marking decoded bits identified as belonging to correctly decoded blocks to form a marked decoded signal.

Alternatively, the method is arranged for decoding a DVB-T signal, wherein step b) comprises: b1) bit de-interleaving the soft metrics before applying the soft metrics to the Viterbi decoder means and byte de-interleaving the block encoded first Viterbi-decoded signal before decoding the block encoded signal; step d) comprises d1) byte interleaving the marked decoded signal to form a byte interleaved marked decoded signal; d2) convolutionally encoding the byte interleaved marked decoded signal to form a convolutional-encoded marked decoded signal; d3) bit interleaving the convolutional-encoded marked decoded signal for application to the modified soft metric generator means; step e) comprises: e1) bit de-interleaving the soft metrics before application thereof to the modified Viterbi decoder means; and step f) comprises f1) byte de-interleaving the second Viterbi-decoded signal before application thereof to the second block decoder means.

According to a second aspect of the invention, there is provided a decoder for a concatenated convolutional-encoded and block encoded signal, the decoder comprising: first soft metric generator means for generating soft metrics from the encoded signal and first delay means for outputting a delayed encoded signal; Viterbi decoder means for decoding the soft metrics representative of convolutional-encoded symbols of the encoded signal thereby generating a block encoded first Viterbi-decoded signal; block decoder means for decoding the block encoded signal and for marking decoded bits identified as belonging to correctly decoded blocks to form a marked decoded signal; modified soft metric generator means arranged to generate modified soft metrics from the delayed encoded signal, constrained by the decoded bits identified as belonging to correctly coded blocks, thereby generating modified soft metrics consistent with the decoded bits identified as belonging to correctly coded blocks; second Viterbi decoder means for decoding the modified soft metrics representation of convolutional-encoded symbols of the delayed encoded signal and for outputting a second block encoded Viterbi-decoded signal; and second block decoder means for decoding the second block encoded signal and outputting a second decoded signal.

Advantageously, the second block decoder means is arranged for marking decoded bits identified as belonging to correctly decoded blocks in the second decoded signal to form a second marked decoded signal; and one or more further stages are provided for progressively delaying the encoded signal and iteratively decoding the encoded signal using the second or further marked decoded signals, to output a further decoded signal.

Preferably, the decoder further comprises modified Viterbi decoder means for applying the delayed encoded signal, the modified soft metrics and the marked decoded signal thereto, the modified Viterbi decoder means being arranged to be constrained by the decoded bits identified as belonging to correctly coded blocks to constrain the Viterbi decoding to bit values consistent with the decoded bits identified as belonging to correctly decoded blocks.

Conveniently, the decoder is arranged for decoding a DVB-DSNG signal, and further comprises: demap uncoded data and byte sync means for applying the first Viterbi-decoded signal and the delayed encoded signal thereto for estimating an uncoded bit from the delayed encoded signal and from a re-coded convolutional-encoded version of the first Viterbi-decoded signal; synchronising means for synchronising the resultant bits and assembling means for assembling the synchronised resultant bits into bytes; and de-interleaving means for de-interleaving the bytes.

Alternatively, the decoder is arranged for decoding a DVB-T signal, and further comprises: bit de-interleaving means for bit de-interleaving the soft metrics before applying the soft metrics to the Viterbi decoder means and byte de-interleaving means for byte de-interleaving the block encoded first Viterbi-decoded signal before decoding the block encoded signal; byte interleaving means for byte interleaving the marked decoded signal to form a byte interleaved marked decoded signal; convolutional encoding means for convolutionally encoding the byte interleaved marked decoded signal to form a convolutional-encoded marked decoded signal; bit interleaving means for bit interleaving the convolutional-encoded marked decoded signal for application to the modified soft metric generator means; bit de-interleaving means for bit de-interleaving the modified soft metrics before application thereof to the modified Viterbi decoder means; and byte de-interleaving means for byte de-interleaving the second block encoded Viterbi-decoded signal before application thereof to the second block decoder means.

BRIEF DESCRIPTION OF THE DRAWINGS

The invention will now be described, by way of example, with reference to the accompanying drawings in which.

In the Figures like reference numerals denote like parts.

DESCRIPTION OF THE PREFERRED EMBODIMENTS

Figure 1:
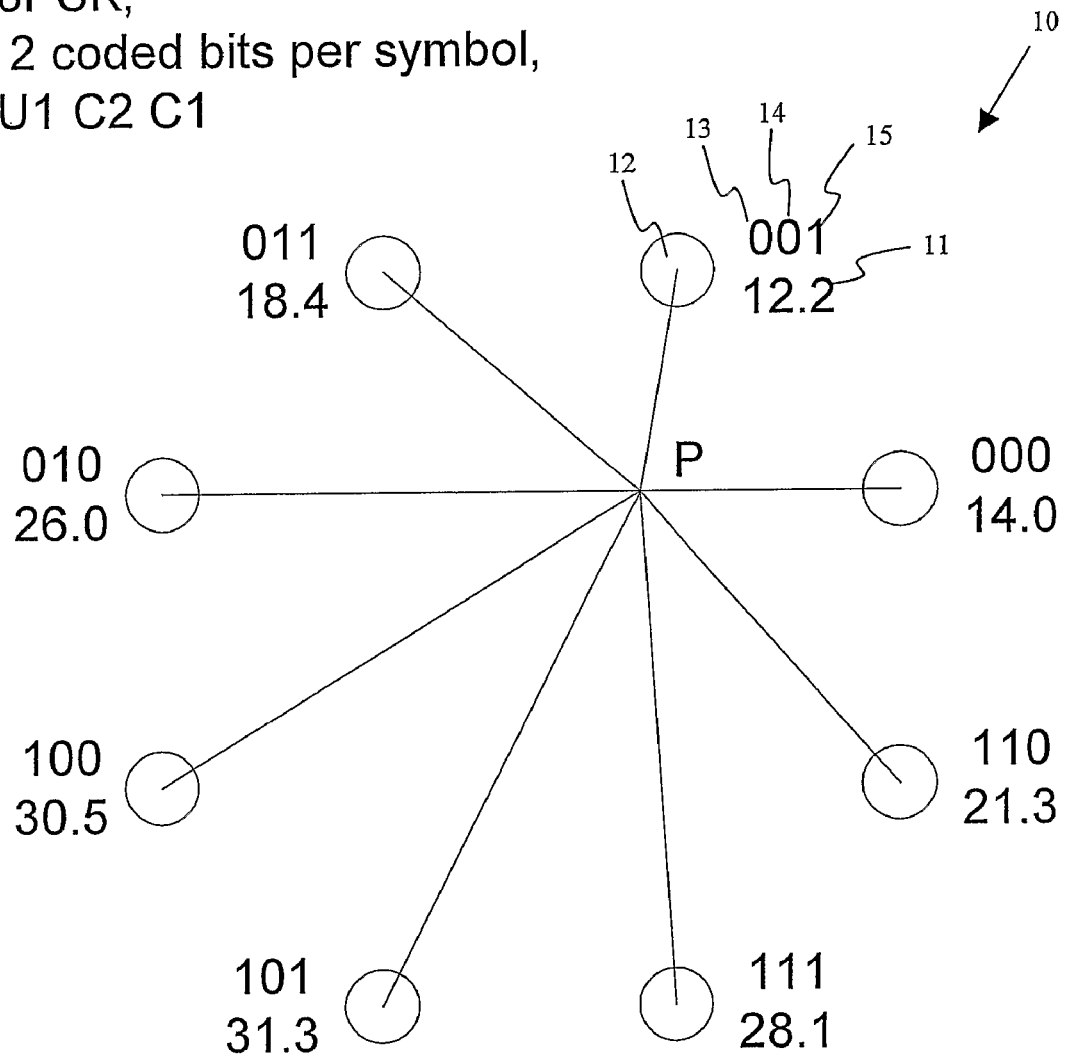
FIG. 1 is a known 8PSK constellation, with two coded bits per symbol.

FIG. 1 shows an 8PSK constellation 10 with two coded bits 14, 15 and one un-coded bit 13 per symbol, together with a distance 11 from each point 12 on the constellation to a received constellation point P. In the Figure, U1, C2, C1 denote respectively the un-coded bit 13, and the two coded bits 14, 15 used in the mapping of the constellation. Thus the constellation point 011 represents U1=0, C2=1, C1=1. To find a conventional soft metric for c1 given P and a given noise model, it is necessary to compute a likelihood of receiving point P given all possible transmitted symbols. Viterbi decoding is known to work well when the soft metrics represent the logarithm of the likelihood of the received signals. Typically the noise model is Gaussian with some variance V, which represents a power of the noise. To compute the soft metric c1 it is necessary to compute the likelihood of the received point P given that C1=0, which is done by adding probabilities that the point P was received for each of the four possible transmitted constellation points which have C1=0. Assuming Gaussian noise, these are derived from a function G(X,V), where X is a Euclidian distance 11 from each such constellation point 12 to the received point P. The calculation is repeated assuming C1=1, i.e. from the other four points. The logarithm likelihood ratio (LLR) is then given by dividing one of these results by the other and taking the logarithm, or by taking logs first and then subtracting as in the following formulae. For example, with Gaussian noise with variance V this gives for the example given in FIG. 1:

$$c1=\ln(G(14.0,V)+G(26.0,V)+G(30.5,V)+G(21.3,V))-\ln(G(12.2,V)+G(18.4,V)+G(31.3,V)+G(28.1,V))$$

where G(X,V) is a Gaussian function with variance V and Variate X.

Similarly, c2 is given by $$c2=\ln(G(14.0,V)+G(12.2,V)+G(30.5,V)+G(31.3,V))-\ln(G(21.3,V)+G(28.1,V)+G(26.0,V)+G(18.4,V))$$

However, where it is known that U1=1, those parts of the constellation that correspond to U1=0 can be discounted, as these points cannot form part of the set of possible transmitted points. Hence the corresponding terms can be removed from the equations for c1 and c2 so that the equations for the modified soft metrics become $$c1=\ln(G(21.3,V)+G(30.5,V))-\ln(G(28.1,V)+G(31.3,V))$$

$$c2=\ln(G(30.5,V)+G(31.3,V))-\ln(G(21.3,V)+G(28.1,V))$$

Using a Gaussian distribution $G(X,V)=\exp(-(X^2)/2*V)/\sqrt{2*Pi}$, the 2*Pi term being a constant can be ignored when, as for present purposes, dealing only with ratios and letting V=40, then the values of the function for the values of X shown in FIG. 1 are as follows:

| X | $\exp(-(X^2)/2*V)$ |
|---|---|
| 12.2 | 1.6E−1 |
| 14.0 | 8.6E−2 |
| 18.4 | 1.5E−2 |
| 21.3 | 3.4E−3 |
| 26.0 | 2.1E−4 |
| 28.1 | 5.2E−5 |
| 30.5 | 8.9E−6 |
| 31.3 | 4.8E−6 |

Since, according to the formula, these values are to be added to determine the soft metrics, it is clear that the values of magnitude E−5 and smaller will have little effect when added to a sum containing terms of magnitude E−1, hence the terms with smallest distance (X) will dominate. That is, for a sufficiently small value of noise variance V, it is a valid assumption that the smallest distance will dominate. V itself is usually chosen a priori, typically as the value of the noise at which the system is expected to fail. It is the value of the assumed noise distribution. Thus in the example above, where U1 is unknown, c1 approximates to:

$$c1 \approx \ln G(14.0,V)-\ln G(12.2,V)$$

i.e. negative c1, representing a probable C1=1, and c2 approximates to:

$$c2 \approx \ln G(14.0,V)-\ln G(21.3,V)$$

i.e. positive c2, representing a probable C2=0.

However, with the knowledge that U1=1, c1 approximates to:

$$c1 \approx \ln G(21.3,V)-\ln G(28.1,V)$$

i.e. positive c1, representing a probable C1=0 and c2 approximates to:

$$c2 \approx \ln G(30.5,V)-\ln G(21.3,V)$$

i.e. negative c2, representing a probable C2=1.

This will constrain subsequent Viterbi decoding.

Figure 2:
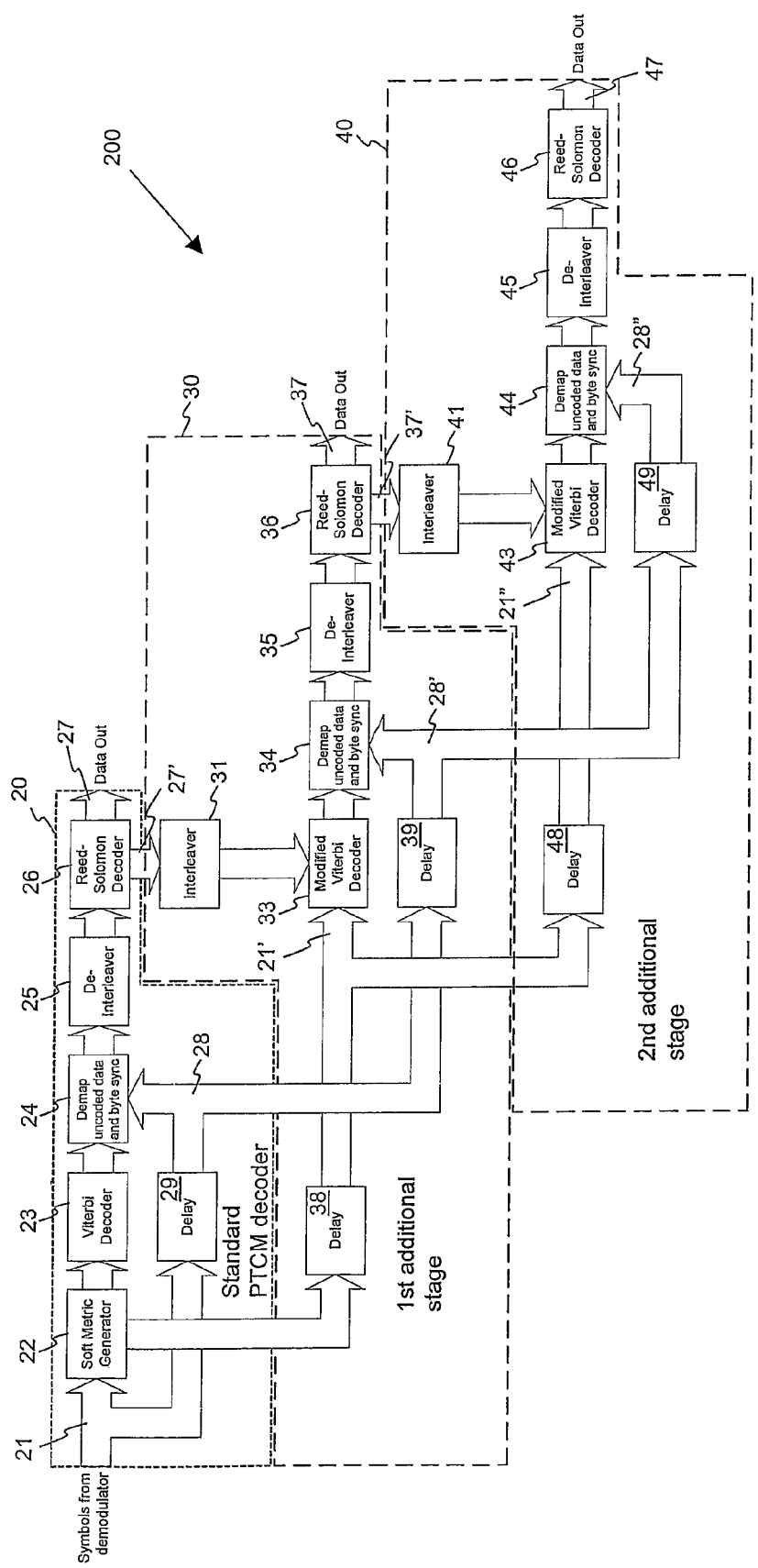
FIG. 2 is a known DVB-DSNG decoder.

FIG. 2 shows a known DVB-DSNG decoder process 200, with a PTCM module incorporating modified Viterbi decoders 33, 43 known from GB 0307092.7, which has a performance advantage over a standard DVB-DSNG decoder process because bits known at a start of each additional stage constrain the modified Viterbi decoders 33, 43 so that the Viterbi decoders make fewer wrong decisions. It will be noted that soft metrics are computed by the soft metrics generator 22 only once and these are delayed and fed to each successive stage 30, 40.

The known concatenated convolutional and block DVB-DSNG decoder process 200, shown in FIG. 2, has an initial stage 20 in which a constellation point of a concatenated convolutional and block encoded data stream 21 from a demodulator, not shown, is input to the soft metric generator 22 and to a first delay 29. The soft metric generator 22 computes and outputs soft metrics with the constellation point to a Viterbi decoder 23, which decodes encoded bits thereof and outputs a Viterbi-decoded data stream to a first demap uncoded data and byte sync module 24, having an additional delayed data stream input 28 from the first delay 29. The first demap uncoded data and byte sync module 24 estimates an uncoded bit U1 from the delayed constellation point and from a re-coded version of the Viterbi decoder output. These bits are synchronised and assembled into bytes before passing to a first de-interleaver 25, a de-interleaved data stream is output from the first de-interleaver 25 to a first Reed-Solomon decoder 26 which outputs a first decoded data stream 27.

In an additional stage 30 in the known decoder process 200, the first decoded data stream 27', in which bits known to be from bytes correctly decoded by the first Reed-Solomon decoder 26 are marked, is interleaved by a first interleaver 31 and the interleaved data stream is input to a first modified Viterbi decoder 33, as described in GB 0307092.7 to take account of bits known to be correct from the first Reed-Solomon decoder 26, arranged to decode the delayed soft metrics data stream 21' output from the soft metric generator 22 and delayed by a second delay 38. The first modified Viterbi decoder 33 outputs a Viterbi-decoded data stream to a second demap uncoded data and byte sync module 34, having an additional input from the data stream 28' successively delayed by the first delay 29 and a third delay 39. The second demap uncoded data and byte sync module 34 estimates the uncoded bit as in the initial stage 20 and outputs an assembled byte to a second de-interleaver 35, a de-interleaved data stream is output from the second de-interleaver 35 to a second Reed-Solomon decoder 36 which outputs a second decoded data stream 37.

In an optional further additional stage 40, the second decoded data stream 37', in which bits known to be from bytes correctly decoded by the second Reed-Solomon decoder 36 are marked, is interleaved by a second interleaver 41 to form a second interleaved data stream which is input to a second modified Viterbi decoder 43, arranged to decode the delayed metrics output from the soft metric generator 22 and delayed successively by the second delay 38 and a fourth delay 48 and constrained by the known marked bits. The second modified Viterbi decoder 43 outputs to a third demap uncoded data and byte sync module 44, having an additional input from the delayed data stream 28'' successively delayed by the first delay 29, the third delay 39 and a fourth delay 49. The third demap uncoded data and byte sync module 44 estimates the uncoded bit and outputs assembled bytes as an interleaved block encoded data stream to a third de-interleaver 45, a block encoded data stream is output by the third de-interleaver 45 to a third Reed-Solomon decoder 46 which outputs a third decoded data stream 47.

Optionally, further additional stages, similar to additional stage 40, may be added.

Describing the known decoder process 200 in summary, encoded symbols 21 are presented to a conventional concatenated decoder stage 20, comprising in sequence a soft metric generator 22, a Viterbi decoder 23, a first demap uncoded data and byte sync module 24, a first de-interleaver 25 and a first Reed-Solomon decoder 26. Output from the soft metric generator 22 is also presented to a delay chain 38, 48. Where an output block of the conventional decoder 20 is indicated as being a valid codeword by the first Reed-Solomon decoder 26, the bytes in this block are marked as being correct. These bytes that are known to be correct are then used after interleaving and serialisation as known bits input to a second stage of the decoder process operating on delayed channel information 21' and incorporating a modified Viterbi algorithm as described in GB-A-0307092.7. This process can be extended to further iterations as required.

That is, by means of a modification to a Viterbi decoder, it is possible to constrain the modified Viterbi decoder 33, 43 to make use of information bits which are known to be correct, i.e. known bits, when the corresponding symbols are presented to the modified Viterbi decoder 33, 43. This not only results in the correct decoding of the known bits, but an improvement is seen in the decoding of bits near in the data stream to the known bits which may be visualised as due to constraining, in the vicinity of the known bit, a Viterbi decoding trellis associated with the modified Viterbi decoder.

For decoding constellations of higher order than QPSK, the present invention provides an additional or alternative method by which data coming from an output of an earlier Reed-Solomon decoding stage may be used to provide improved decoding for data that has not yet been determined to be correct, which provides an additional or alternative improvement compared with a mere extension of the method known from GB 0307092.7 to such higher order constellations.

Figure 3:
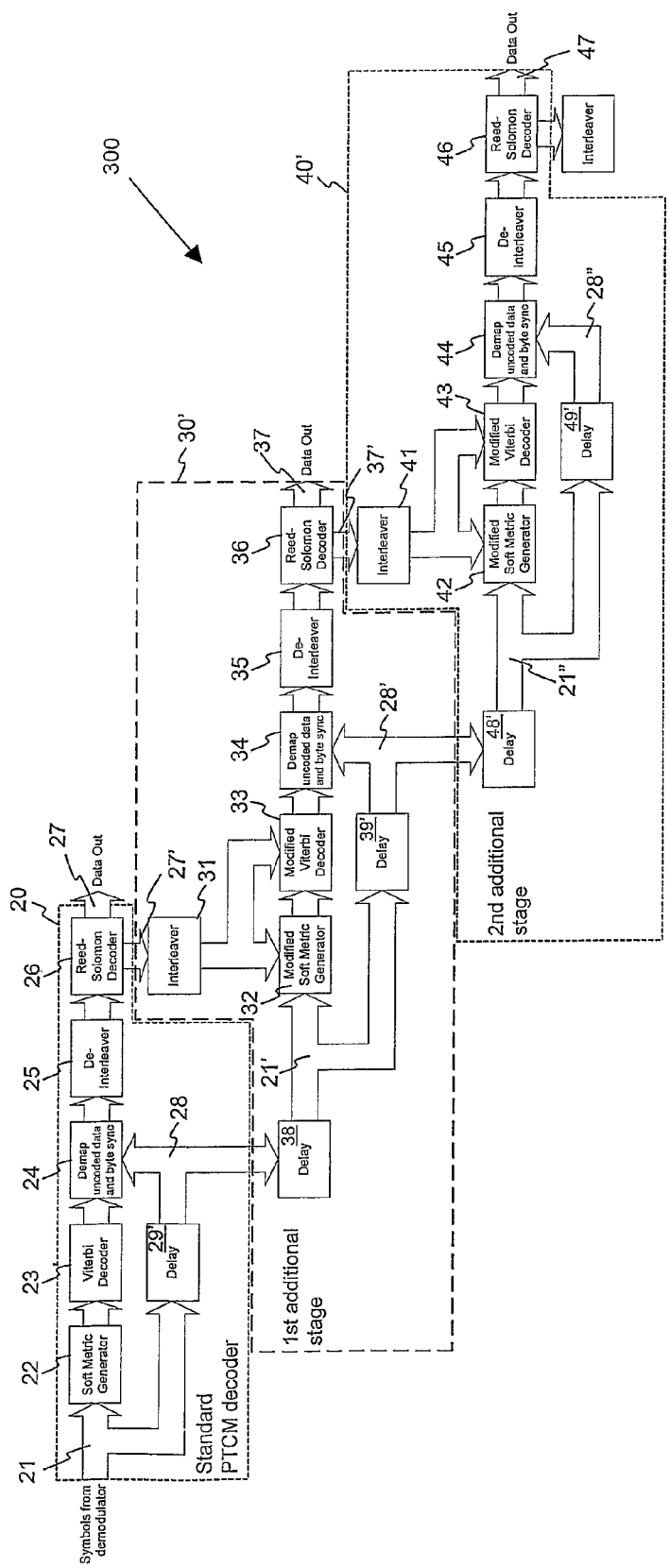
FIG. 3 is a DVB-DSNG decoder according to the present invention.

FIG. 3 shows a DVB-DSNG decoder process 300 according to the invention in which, instead of being calculated only once, soft metrics are recalculated at each successive iteration stage dependent on known bits coming from the output of a previous stage when a Reed-Solomon decoder indicates correct decoding. Therefore, a modified soft metric generator 32, 42 is provided in each additional stage, respectively. When the uncoded bits are not known, because the previous Reed-Solomon decoder indicates a block error for the block that contained those bits, the soft metric generation makes no use of the information; its result for such symbols is identical to that of an unmodified soft metric generator.

In more detail, the concatenated convolutional and block DVB-DSNG decoder process 300 according to the invention, shown in FIG. 3, has a known initial stage 20 substantially as described above but without a second output from the soft metric generator 22, as in the prior art. That is, a constellation point of a concatenated convolutional and block encoded data stream 21 from a demodulator, not shown, is input to the soft metric generator 22 and to a first delay 29'. The soft metric generator 22 generates and outputs soft metrics with the constellation point to a Viterbi decoder 23, which decodes convolutional-encoded bits thereof and outputs a Viterbi-decoded data stream to a demap uncoded data and byte sync module 24, having an additional delayed data stream 28 input from the first delay 29'. The first demap uncoded data and byte sync module 24 estimates an uncoded bit U1 from the delayed constellation point and from a re-coded version of the Viterbi decoder output. These bits are synchronised and assembled into bytes before passing to a first de-interleaver 25, a block encoded data stream is output from the first de-interleaver 25 to a first Reed-Solomon decoder 26 which outputs a first decoded data stream 27.

In an additional stage 30' in the decoder process 300 according to the invention, the first decoded data stream 27', in which bits known to be from bytes correctly decoded by the first Reed-Solomon decoder 26 are marked, is interleaved by a first interleaver 31 and the interleaved data stream is input to both a first modified soft metric generator 32 and a first modified Viterbi decoder 33 as described in GB 0307092.7, arranged to decode the concatenated convolutional and block encoded data stream 21' delayed sequentially by the first delay 29' and by a second delay 38', constrained by the known bits. The first modified soft metric generator 32 outputs soft metrics, also constrained, as described previously herein, by known bits in the first decoded marked data stream 27' output from the initial stage 20, to a first modified Viterbi decoder 33. The first modified Viterbi decoder 33, itself constrained by known bits output from the initial stage 20, decodes convolutional-encoded bits of the soft metrics and outputs a second Viterbi-decoded data stream to a second demap uncoded data and byte sync module 34, having a further successively delayed data stream 28' input from the first delay 29', the second delay 38' and a third delay 39'. The second demap uncoded data and byte sync module 34 estimates an uncoded bit U1 from the delayed constellation point and from a re-coded version of the second Viterbi decoder output. These bits are synchronised and assembled into bytes before passing to a second de-interleaver 35, a block encoded data stream is output from the second de-interleaver 35 to a second Reed-Solomon decoder 36 which outputs a second decoded data stream 37.

In an optional further additional stage 40', the second decoded data stream 37', in which bits known to be from bytes correctly decoded by the second Reed-Solomon decoder 36 are marked, is interleaved by a second interleaver 41 and the interleaved data stream is input to a second modified soft metric generator 42 and to a second modified Viterbi decoder 43, arranged to decode the concatenated convolutional and block encoded data stream 21" delayed successively by the first delay 29', the second delay 38', the third delay 39' and a fourth delay 48'. The second modified soft metric generator 42 outputs soft metrics, constrained by known bits in the second decoded data stream 37, as described previously herein, to a second modified Viterbi decoder 43, which decodes encoded bits thereof constrained by known bits output from the first additional stage 30' and outputs a third Viterbi-decoded data stream to a third demap uncoded data and byte sync module 44, having an additional further delayed data stream 28" input successively delayed by the first delay 29', the second delay 38', the third delay 39', the fourth delay 48' and a fifth delay 49'. The third demap uncoded data and byte sync module 44 estimates an uncoded bit U1 from the further delayed constellation point and from a re-coded version of the second modified Viterbi decoder 43 output. These bits are synchronised and assembled into bytes before passing to a third de-interleaver 45, a block encoded data stream is output from the third de-interleaver 45 to a third Reed-Solomon decoder 46 which outputs a third decoded data stream 47.

Optionally, further additional stages, similar to additional stage 40', may be added.

Describing the decoder process 300 of the invention in summary, encoded symbols 21 are presented to a conventional first stage 20 of a concatenated decoder 300, comprising in sequence a soft metric generator 22, a Viterbi decoder 23, a first demap uncoded data and byte sync module 24, a first de-interleaver 25 and a first Reed-Solomon decoder 26. The encoded symbols 21 are also presented to a delay chain 29', 38', 39', 48' and 49'. Where an output block of the conventional decoder 20 is indicated as being a valid codeword by the first Reed-Solomon decoder 26, the bytes in this block are marked as being correct. These bytes that are known to be correct are then used after interleaving and serialisation as known bits input to a second stage 30' of the decoder process operating on delayed channel information 21' and incorporating a modified soft metric generator and a modified Viterbi algorithm, which are both constrained by the known bits. This process can be extended to further iterations as required.

Therefore, in the present invention, information from previous stages of decoding may be used to benefit the performance of the decoder process by modifying the behaviour of the soft metric generator. This may provide some benefit in decoding performance even if the modified Viterbi decoder 33, 43 disclosed in GB 0307092.7 is not used.

Figure 4:
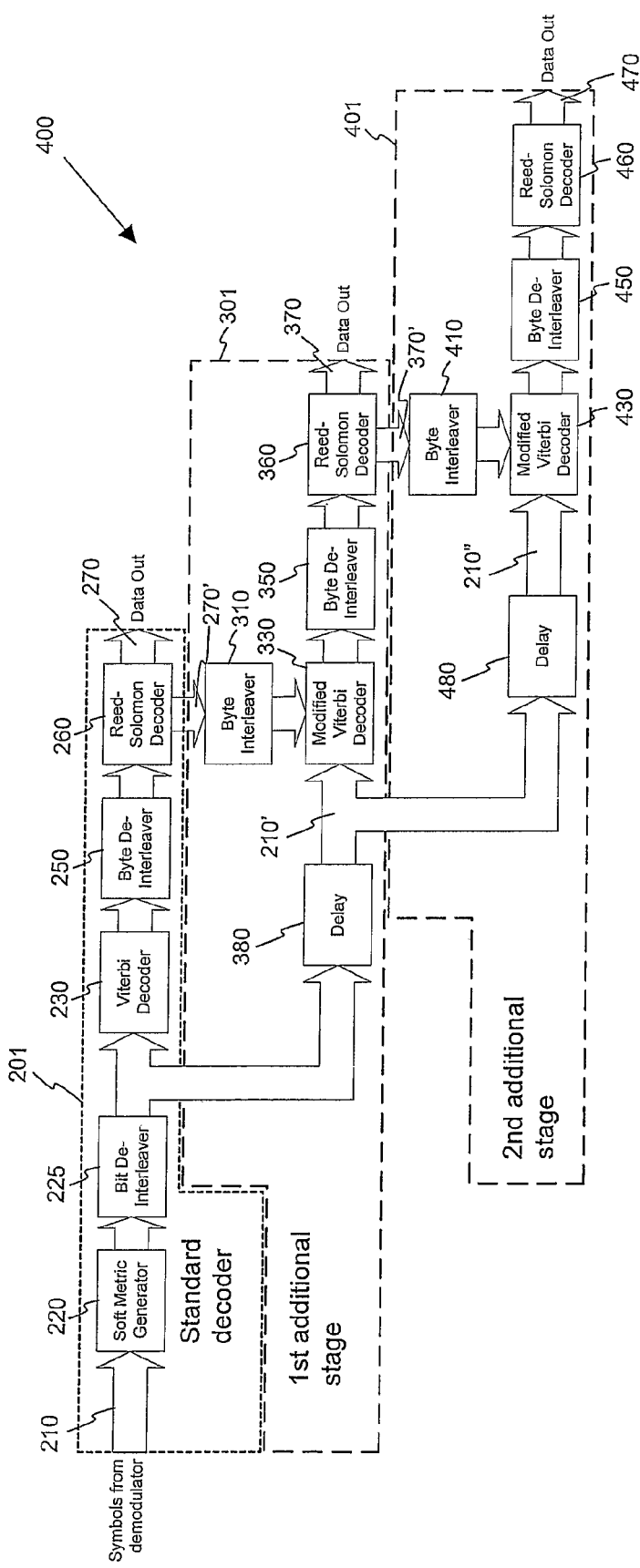
FIG. 4 is a known DVB-T decoder.
Figure 5:
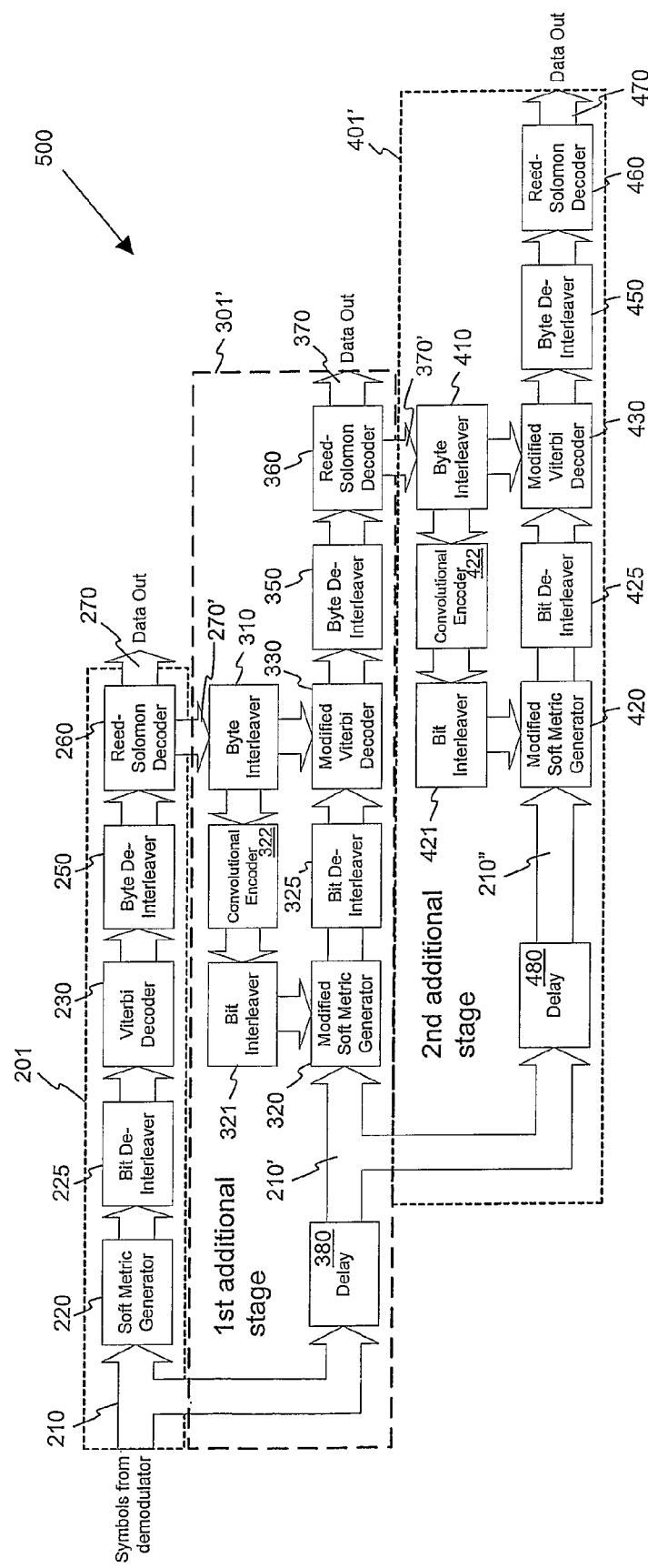
FIG. 5 is a DVB-T decoder according to the present invention.

Referring to FIGS. 4 and 5, a known DVB-T specification requires an extra bit interleaver in the encoder, which is replicated in the decoder.

According to the known DVB-T specification, during coding all bits are passed through a convolutional encoder before being mapped onto a higher order constellation, that is, there are no uncoded bits U1 as in the PTCM specification. If some of the data is known from previous decoding stages it is necessary to recode these into convolutional-encoded bits before the known bits can be used to modify a subsequent soft metric generation stage. This does not apply for the PTCM (higher order satellite) decoder process described previously herein because in this PTCM decoder the modifying bits always come from the uncoded data bits U1.

FIG. 4 shows a known DVB-T decoder process as modified using modified Viterbi decoders 330, 430 known from GB 0307092.7, which has a performance advantage over a standard DVB-T decoder process because bits known at a start of each additional stage constrain the modified Viterbi decoders 330, 430 so that they make fewer wrong decisions. It will be noted that in this prior art decoder soft metrics are computed only once and the soft metrics are delayed and fed to each successive stage.

The known concatenated convolutional and block DVB-T decoder process 400, shown in FIG. 4, has a initial stage 201 in which a concatenated convolutional and block encoded data stream 210 from a demodulator, not shown, is input to a soft metric generator 220, which outputs the soft metrics to a bit de-interleaver 225 which outputs a de-interleaved data stream and the soft metrics to a Viterbi decoder 230 which decodes the soft metrics and outputs a Viterbi-decoded data stream to a first byte de-interleaver 250. A de-interleaved data stream is output from the first byte de-interleaver 250 to a first Reed-Solomon decoder 260 which outputs a first decoded data stream 270.

In an additional stage 301 in the known decoder process 400, the first decoded data stream 270', in which bits known to be from bytes correctly decoded by the first Reed-Solomon decoder 260 are marked, is interleaved by a first byte interleaver 310 and the interleaved data stream is input to a first modified Viterbi decoder 330, as described in GB 0307092.7, arranged to decode the concatenated soft metrics and block encoded data stream 210' delayed by a first delay 380, modified by bits known to be correct from the initial stage 201. The first modified Viterbi decoder 330 outputs a second Viterbi-decoded data stream to a second byte de-interleaver 350, a de-interleaved stream is output from the second byte de-interleaver 350 to a second Reed-Solomon decoder 360 which outputs a second decoded data stream 370.

In an optional further additional stage 401, the second decoded data stream 370', in which bits known to be from bytes correctly decoded by the second Reed-Solomon decoder 360 are marked, is interleaved by a second byte interleaver 410 and the interleaved data stream is input to a second modified Viterbi decoder 430, arranged to decode the concatenated soft metrics and block encoded data stream 210" delayed successively by the first delay 380 and a second delay 480, taking advantage of further bits known to be correct from the first additional stage 301. The second modified Viterbi decoder 430 outputs a third Viterbi-decoded data stream to a third byte de-interleaver 450, a de-interleaved data stream is output by the third byte de-interleaver 450 to a third Reed-Solomon decoder 460 which outputs a third decoded data stream 470.

Optionally, further additional stages, similar to additional stage 401, may be added.

Describing the known process 400 in summary, encoded symbols 210 are presented to a conventional concatenated decoder stage 201, comprising in sequence a soft metric generator 220, a bit de-interleaver 225, a Viterbi decoder 230, a first byte de-interleaver 250 and a first Reed-Solomon decoder 260. Output from the bit de-interleaver 225 is also presented to a delay chain 380, 480. Where an output block of the conventional decoder stage 201 is indicated as being a valid codeword by the first Reed-Solomon decoder 260, the bytes in this block are marked as being correct. These bytes that are known to be correct are then used after interleaving and serialisation as known bits input to a second stage 301 of the decoder process operating on the delayed channel information 210' and incorporating a modified Viterbi algorithm, constrained by the known bits. This process can be extended to further iterations as required.

That is, by means of a modification to the Viterbi decoder, as described in GB 0307092.7, it is possible to constrain modified Viterbi decoders 330, 430 to make use of information bits which are known to be correct, i.e. known bits, when the corresponding symbols are presented to the modified Viterbi decoders 330, 430. This not only results in the correct decoding of the known bits, but an improvement is seen in the decoding of bits near to the known bits in the data stream which may be visualised as due to constraining, in the vicinity of the known bit, a Viterbi decoding trellis associated with the modified Viterbi decoder.

As described in relation to a DVB-DSNG decoder, for decoding higher order constellations than QPSK, the present invention provides an additional or alternative method by which data coming from an output of an earlier Reed-Solomon decoding stage may be used to provide improved decoding for the data that has not yet been determined to be correct, which provides an additional or alternative improvement compared with a mere extension of the method known from GB 0307092.7.

FIG. 5 shows a DVB-T decoder process according to the invention in which soft metrics are recalculated at each successive iteration dependent on known bits coming from the output of a previous stage when a Reed-Solomon decoder indicates correct decoding. Therefore, a modified soft metric generator, 320, 420 is provided in each additional stage respectively. When none of the bits are known, because the previous Reed-Solomon decoder indicates a block error for the block that contained those bits, the soft metric generators 320, 420 make no use of the previously decoded bits; their result for such symbols is identical to that of an unmodified soft metric generator.

In detail, the concatenated convolutional and block DVB-T decoder process 500, shown in FIG. 5, has a known initial stage 201 in which a concatenated convolutional and block encoded data stream 210 from a demodulator, not shown, is input to a soft metric generator 220, which outputs soft metrics to a first bit de-interleaver 225 which outputs a de-interleaved data stream to a Viterbi decoder 230 which decodes the soft metrics representing convolutional-encoded bits of the data stream. The Viterbi decoder 230 outputs a Viterbi-decoded data stream to a first byte de-interleaver 250. A de-interleaved block encoded data stream is output from the first byte de-interleaver 250 to a first Reed-Solomon decoder 260 which outputs a first decoded data stream 270.

In an additional stage 301' in the decoder process 500 of the invention, the first decoded data stream 270', in which bits known to be from bytes correctly decoded by the first Reed-Solomon decoder 260 are marked, is interleaved by a first byte interleaver 310 and the interleaved data stream is input to a first modified Viterbi decoder 330, as described in GB 0307092.7 arranged to decode the delayed concatenated convolutional and block encoded data stream 210', delayed by a first delay 380, constrained by bits known to be correct from the initial stage 201. The interleaved data stream is also input to a first convolutional encoder 322 an output of which is input to a first bit interleaver 321. A bit interleaved output from the first bit interleaver 321 is input, together with the delayed data stream 210', delayed by the first delay 380, to a modified soft metric generator 320, which generates soft metrics constrained by marked known bits input from the initial stage 201. Soft metrics from first modified soft metric generator 320 are input to a second bit de-interleaver 325. A de-interleaved data stream are input to the first modified Viterbi decoder 330 where the soft metrics representing the convolutional-encoded bits are decoded, constrained by the known bits input to the first modified Viterbi decoder from the initial stage 201. The first modified Viterbi decoder 330 outputs a second Viterbi-decoded data stream to a second byte de-interleaver 350, a de-interleaved data stream is output from the second byte de-interleaver 350 to a second Reed-Solomon decoder 360 which outputs a second decoded data stream 370.

In an optional further additional stage 401', the second decoded data stream 370', in which bits known to be from bytes correctly decoded by the second Reed-Solomon decoder 360 are marked, is interleaved by a second byte interleaver 410 and the interleaved decoded data stream is input to a second modified Viterbi decoder 430, arranged to decode the concatenated convolutional and block encoded data stream 210" delayed successively by the first delay 380 and a second delay 480, constrained by bits which are known from the first additional stage 301'. The interleaved data stream is also input to a second convolutional encoder 422 an output of which is input to a third bit interleaver 421. A bit interleaved output from the second bit interleaver 421 is input, together with the data stream 210", delayed successively by the first delay 380 and a second delay 480, to a second modified soft metric generator 420, to generate soft metrics constrained by marked bits known to be correctly decoded by the first additional stage 301'. Output from second modified soft metric generator 420 is output through a third bit de-interleaver 425 to the second modified Viterbi decoder 430. The second modified Viterbi decoder 430 decodes the soft metrics output from the second modified soft metric generator 420 constrained by marked bits known to be correctly decoded by the first additional stage 301'. A consequential interleaved data stream is output to a third byte de-interleaver 450, and a de-interleaved block encoded data stream is output by the third byte de-interleaver 450 to a third Reed-Solomon decoder 460 which outputs a third decoded data stream 470.

Optionally, further additional stages, similar to additional stage 401', may be added.

Describing the decoder process 500 of the invention in summary, encoded symbols 210 are presented to a conventional concatenated decoder stage 201, comprising in sequence a soft metric generator 220, a first bit de-interleaver 225, a Viterbi decoder 230, a first byte de-interleaver 250 and a first Reed-Solomon decoder 260. The encoded symbols 210 are also presented to a delay chain 380, 480. Where an output block of the conventional decoder 201 is indicated as being a valid codeword by the first Reed-Solomon decoder 260, the bytes in this block are marked as being correct. These bytes that are known to be correct are then used after interleaving and serialisation as known bits input to a second stage 301' of decoding, operating on the delayed channel information 210' and incorporating a modified soft metric generator and, optionally, a modified Viterbi algorithm both constrained by the known bits. This process can be extended to further iterations as required.

Therefore, in the present invention, information from previous stages of decoding may be used to benefit the decoder performance by modifying the behaviour of the soft metric generator. This may provide some benefit in decoding performance even if the modified Viterbi decoder disclosed in GB 0307092.7 is not used.

The invention claimed is:

1. A method of decoding a concatenated convolutional-encoded and block encoded signal, the method comprising the steps of:
   a) applying the encoded signal to a first soft metric generator means to generate soft metrics and to a first delay means to output a delayed encoded signal;
   b) applying the first soft metrics to a first Viterbi decoder means to decode the soft metrics representing convolutional-encoded symbols of the encoded signal and to output a first block encoded Viterbi-decoded signal;
   c) decoding the block encoded signal with a first block decoder means and marking decoded bits identified as belonging to correctly decoded blocks to form a marked decoded signal;
   d) applying the delayed encoded signal and the marked decoded signal to a modified soft metric generator means arranged to generate modified soft metrics for remaining uncertain bits constrained by the decoded bits identified as belonging to correctly decoded blocks to generate modified soft metrics for remaining uncertain bits consistent with the decoded bits identified as belonging to correctly coded blocks;
   e) applying the modified soft metrics to a second Viterbi decoder means to decode the modified soft metrics representative of convolutional encoded symbols of the delayed encoded signal and to output a block encoded second Viterbi-decoded signal; and
   f) decoding the block encoded second Viterbi-decoded signal with a second block decoder means and outputting a second decoded signal.

2. The method as claimed in claim 1, comprising the further steps of:
   g) marking decoded bits identified as belonging to correctly decoded blocks in the second decoded signal to form a second marked decoded signal; and
   h) iteratively repeating steps d) to f) with the second marked decoded signal, to output a further decoded signal.

3. The method as claimed in claim 1, wherein the step e) comprises applying the delayed encoded signal, the modified soft metrics and the marked decoded signal to modified Viterbi decoder means wherein the modified Viterbi decoder means is arranged to be constrained by the decoded bits identified as belonging to correctly decoded blocks to constrain the Viterbi decoding to bit values consistent with the decoded bits identified as belonging to correctly coded blocks.

4. The method as claimed in claim 3 for decoding a Digital Video Broadcasting-Digital Satellite News Gathering (DVB-DSNG) signal, where step c) comprises:
   c1) applying the first Viterbi-decoded signal and the delayed encoded signal to demap uncoded data means and byte sync means to estimate an uncoded bit from the delayed encoded signal and from a re-coded convolutional-encoded version of the first Viterbi-decoded signal and for synchronising the resultant bits and assembling the synchronised resultant bits into bytes, respectively;
   c2) de-interleaving the bytes; and
   c3) decoding the bytes with the block decoder means and marking decoded bits identified as belonging to correctly decoded blocks to form a marked decoded signal.

5. The method as claimed in claim 3 for decoding a Digital Video Broadcasting-Terrestrial (DVB-T) signal, wherein step b) comprises:
   b1) bit de-interleaving the soft metrics before applying the soft metrics to the Viterbi decoder means and byte de-interleaving the block encoded first Viterbi-decoded signal before decoding the block encoded signal;
   step d) comprises:
   d1) byte interleaving the marked decoded signal to form a byte interleaved marked decoded signal;
   d2) convolutionally encoding the byte interleaved marked decoded signal to form a convolutional-encoded marked decoded signal;
   d3) bit interleaving the convolutional-encoded marked decoded signal for application to the modified soft metric generator means;
   step e) comprises:
   e) bit de-interleaving the soft metrics before application thereof to the modified Viterbi decoder means; and
   step f) comprises
   f1) byte de-interleaving the second Viterbi-decoded signal before application thereof to the second block decoder means.

6. A decoder for a concatenated convolutional-encoded and block encoded signal, the decoder comprising:
   a first soft metric generator means for generating soft metrics from the encoded signal and first delay means for outputting a delayed encoded signal;
   a first Viterbi decoder means for decoding the soft metrics representative of convolutional-encoded symbols of the encoded signal thereby generating a block encoded first Viterbi-decoded signal;
   a first block decoder means for decoding the block encoded signal and for marking decoded bits identified as belonging to correctly decoded blocks to form a marked decoded signal;
   a modified soft metric generator means arranged to generate modified soft metrics for remaining uncertain bits from the delayed encoded signal, constrained by the decoded bits identified as belonging to correctly coded blocks, thereby generating modified soft metrics for remaining uncertain bits consistent with the decoded bits identified as belonging to correctly coded blocks;
   a second Viterbi decoder means for decoding the modified soft metrics representative of convolutional-encoded symbols of the delayed encoded signal and for outputting a second block encoded Viterbi-decoded signal; and
   second block decoder means for decoding the second block encoded signal and outputting a second decoded signal.

7. A decoder as claimed in claim 6, wherein:
   the second block decoder means is arranged for marking decoded bits identified as belonging to correctly decoded blocks in the second decoded signal to form a second marked decoded signal; and one or more further stages are provided for progressively delaying the encoded signal and iteratively decoding the encoded signal using the second or further marked decoded signals, to output a further decoded signal.

8. A decoder as claimed in claim 6, further comprising modified Viterbi decoder means for applying the delayed encoded signal, the modified soft metrics and the marked decoded signal thereto, the modified Viterbi decoder means being arranged to be constrained by the decoded bits identified as belonging to correctly coded blocks to constrain the Viterbi decoding to bit values consistent with the decoded bits identified as belonging to correctly decoded blocks.

9. A decoder as claimed in claim 8 for decoding a Digital Video Broadcasting-Digital Satellite News Gathering (DVB-DSNG) signal, further comprising:

demap uncoded data means and byte sync means for applying the first Viterbi-decoded signal and the delayed encoded signal thereto for estimating an uncoded bit from the delayed encoded signal and from a re-coded convolutional-encoded version of the first Viterbi-decoded signal and for synchronising the resultant bits and assembling means for assembling the synchronised resultant bits into bytes, respectively; and de-interleaving means for de-interleaving the bytes.

10. A decoder as claimed in claim 8 for decoding a Digital Video Broadcasting-Terrestrial (DVB-T) signal, further comprising:

bit de-interleaving means for bit de-interleaving the soft metrics before applying the soft metrics to the Viterbi decoder means and byte de-interleaving means for byte de-interleaving the block encoded first Viterbi-decoded signal before decoding the block encoded signal in first block decoder means;

byte interleaving means for byte interleaving the marked decoded signal to form a byte interleaved marked decoded signal;

convolutional encoding means for convolutionally encoding the byte interleaved marked decoded signal to form a convolutional-encoded marked decoded signal;

bit interleaving means for bit interleaving the convolutional-encoded marked decoded signal for application to the modified soft metric generator means;

bit de-interleaving means for bit de-interleaving the modified soft metrics before application thereof to the modified Viterbi decoder means; and byte de-interleaving means for byte de-interleaving the second block encoded Viterbi-decoded signal before application thereof to the second block decoder means.

* * * * *